United States Patent
Valli et al.

(10) Patent No.: US 11,841,378 B2
(45) Date of Patent: Dec. 12, 2023

(54) ROTATION RATE SENSOR AND METHOD FOR OPERATING A ROTATION RATE SENSOR

(71) Applicant: Robert Bosch GmbH, Stuttgart (DE)

(72) Inventors: Luca Valli, Munich (DE); Andrea Visconti, Munich (DE); Francesco Diazzi, Munich (DE)

(73) Assignee: ROBERT BOSCH GMBH, Stuttgart (DE)

( * ) Notice: Subject to any disclaimer, the term of this patent is extended or adjusted under 35 U.S.C. 154(b) by 473 days.

(21) Appl. No.: 17/185,272

(22) Filed: Feb. 25, 2021

(65) Prior Publication Data
US 2021/0293843 A1 Sep. 23, 2021

(30) Foreign Application Priority Data
Mar. 19, 2020 (DE) .......................... 102020203571.7

(51) Int. Cl.
*G01R 33/00* (2006.01)
*G01P 3/46* (2006.01)
*H03M 3/00* (2006.01)

(52) U.S. Cl.
CPC ............... *G01P 3/46* (2013.01); *H03M 3/352* (2013.01); *H03M 3/458* (2013.01)

(58) Field of Classification Search
CPC ............... G01R 33/00; G01R 33/0035; G01R 33/0023; G01R 33/0017; G01R 31/3191; G01B 7/004; G01C 17/38; G06F 3/017; G06F 3/0346; G06F 3/012; G01P 3/46; H03M 3/352; H03M 3/458
See application file for complete search history.

(56) References Cited

U.S. PATENT DOCUMENTS

| | | | |
|---|---|---|---|
| 6,140,952 A | 10/2000 | Gaboury | |
| 9,484,890 B1 | 11/2016 | Cazzaniga et al. | |
| 2011/0041609 A1* | 2/2011 | Clark | G01C 19/5712 73/514.29 |
| 2017/0023364 A1* | 1/2017 | Gregory | G01P 21/00 |

* cited by examiner

*Primary Examiner* — Jermele M Hollington
*Assistant Examiner* — Taqi R Nasir
(74) *Attorney, Agent, or Firm* — NORTON ROSE FULBRIGHT US LLP; Gerard Messina

(57) ABSTRACT

A rotation rate sensor, including at least: one oscillating mass, deflectable in a drive direction and in a detection direction oriented perpendicularly to the drive direction; one drive circuit for prompting a defined oscillatory movement of the oscillating mass in the drive direction; one circuit for detecting a measuring signal, which corresponds to the deflection of the oscillating mass in the detection direction; and one read-out circuit for reading out and pre-processing the measuring signal. The read-out circuit includes a demodulator, with which a useful signal and a quadrature signal are extractable from the measuring signal. The read-out circuit includes a sigma-delta A/D converter. An offset voltage is feedable to the sigma-delta A/D converter, which is selected in such a way that tonal artifacts in the frequency spectrum of the digitized useful signal are shifted into a frequency range outside of the bandwidths of the useful signal to be expected.

14 Claims, 4 Drawing Sheets

ROTATION RATE SENSOR AND METHOD FOR OPERATING A ROTATION RATE SENSOR

CROSS REFERENCE

The present application claims the benefit under 35 U.S.C. § 119 of German Patent Application No. DE 102020203571.7 filed on Mar. 19, 2020, which is expressly incorporated herein by reference in its entirety.

FIELD

The present invention relates to a rotation rate sensor. The present invention also relates to a method for operating a rotation rate sensor.

BACKGROUND INFORMATION

Rotation rate sensors measure the rotation velocity of a body. A commercially available rotation rate sensor could include the following components: an oscillating mass, which is deflectable in a drive direction and a detection direction oriented perpendicularly to the drive direction; a drive circuit for prompting a defined oscillatory movement of the oscillating mass in the drive direction; a circuit for detecting a measuring signal, which corresponds to the deflection of the oscillating mass in the detection direction; a read-out circuit for reading out and pre-processing the measuring signal. The read-out circuit includes a demodulator, with which a useful signal and a quadrature signal are extractable from the measuring signal. The read-out circuit includes, at least for the useful signal, a sigma-delta A/D converter, via which a bit sequence including the logic values 0 and 1 is generatable.

The extracted quadrature signal, since it remains constant or changes slowly, injects a DC voltage offset into the sigma-delta converter, which causes the generation of undesirable sounds, i.e., spectral components at a defined frequency, in the frequency spectrum of the digital bit stream. The frequency of the sounds is proportional to the DC voltage offset at the input of the analog-digital converter.

At low DC voltage values, these sounds are situated in the signal bandwidth and worsen the signal-to-quantization-noise ratio or "SQNR" of the analog-digital converter. In order to suppress the sounds, dithering is applied: a pseudo-random noise is injected into the analog-digital converter in order to interrupt the periodic forms caused by the input of DC components.

In order to ensure an effective dithering, a sufficient noise power must be injected. The quantization noise of the output of the analog-digital converter increases as a result. A further disadvantage is that the dithering increases the temporal variation of the output signal of the integrator of the sigma-delta converter. In a higher-order single bit sigma-delta converter, this means that the stable input range, i.e., the maximum input amplitude at which the analog-digital converter is stable, is reduced.

Moreover, particular attention must be paid when implementing the arrangement of the analog-digital converter in order to reduce the parasitic coupling between particular nodes of the analog-digital converter. These couplings may result in a shift of the higher frequency sounds into a lower frequency range, which requires an even higher dithering.

One alternative to dithering is the injection of a D/C voltage offset or an offset voltage, which eliminates the sound or sounds from the signal band. The injection of the D/C voltage offset requires a careful assessment of the amplitude of the offset. The injection of the D/C voltage offset results in an increase in the thermal noise and in a loss of the signal fluctuation (signal swing) or in an increase in the quantization noise, all of which are proportional to the amplitude of the offset.

On the one hand, it is important to keep the D/C voltage offset or the offset voltage low in order to preferably avoid the aforementioned disadvantages. On the other hand, the offset voltage must be sufficiently high in order to eliminate the sounds from the range of the signal band, at least for a small angle velocity in all operating conditions, i.e., for an arbitrary value of the quadrature.

U.S. Patent Application Publication No. US 2017/0023364 A1 describes a method for compensating for a sensitivity of an inertial sensor including a resonator and an acceleration sensor. The method includes: adding a test signal to a quadrature tuning voltage, which is applied to the resonator of the inertial sensor; receiving a quadrature error signal from the acceleration sensor of the inertial sensor; detecting a phase difference between the quadrature error signal and the test signal; and determining a bandwidth of the acceleration sensor based on the detected phase difference. The bandwidth indicates the sensitivity of the acceleration sensor.

SUMMARY

The present invention provides a rotation rate sensor and a method for operating a rotation rate sensor.

Preferred refinements are the present invention are disclosed herein.

According to one aspect, the present invention relates to a rotation rate sensor. In accordance with an example embodiment of the present invention, the rotation rate sensor include at least: one oscillating mass, which is deflectable in a drive direction and in a detection direction oriented perpendicularly to the drive direction; one drive circuit for prompting a defined oscillatory movement of the oscillating mass in the drive direction; one circuit for detecting a measuring signal, which corresponds to the deflection of the oscillating mass in the detection direction; one read-out circuit for reading out and pre-processing the measuring signal. The read-out circuit includes a demodulator with which a useful signal and a quadrature signal are extractable from the measuring signal. The read-out circuit includes a sigma-delta A/D converter at least for the useful signal, via which a bit sequence including the logic values 0 and 1 is generatable. An offset voltage is feedable to the sigma-delta A/D converter, which is selected in such a way that tonal artifacts in the frequency spectrum of the digitized useful signal, which are caused by a low signal amplitude and/or a DC voltage component in the useful signal, are shifted into a frequency range outside of the bandwidths of the useful signal to be expected.

According to an example embodiment of the present invention, a new approach for the front end of rotation rate sensors is provided, in which the amplitude of the DC voltage offset or the offset voltage may be programmed as a function of the quadrature signal. This is possible and relatively easy to implement, since the quadrature signal has already been read by the demodulator of the read-out circuit of a rotation rate sensor.

Alternatively, the programming of the amplitude of the offset voltage may take place via a manual calibration, since the quadrature signal does not change significantly over time, or takes place via an automatic calibration with each start-up of a rotation rate sensor.

The manual or automatic calibration of the offset voltage as a function of the amplitude of the quadrature signal enables a lower impact on the performance of the sigma-delta converter with respect to noise and signal fluctuations, as compared to the related art.

The present invention is an alternative to dithering for solving the problem relating to the presence of sounds in vibrating gyroscopes that include sigma-delta converters, as a result of which the above-mentioned disadvantages of dithering may be preferably avoided.

One possibility is to inject a constant DC voltage offset, regardless of the output value of the sigma-delta converter. As a result, the full scope or the full scale of the analog-digital converter remains unchanged, as does the quantization noise. In addition, the offset voltage generates a low thermal noise, which is proportional to the amount of the offset input. The offset voltage utilizes a portion of the full scope or the full scale of the analog-digital converter.

In one preferred specific embodiment of the rotation rate sensor according to the present invention, it is provided that the offset voltage, in particular, the sign of the offset voltage, is selected as a function of the quadrature signal.

It should be considered that the quadrature signal also generates an offset. The entire input offset must therefore be considered when calculating the frequency of the sound. The injected or input offset voltage is identified by Voff, and the quadrature is identified by $Q_A$. The worst case occurs when Voff and $Q_A$ have reversed signs, because a lower input offset brings the sound to a lower frequency. This means that Voff must be dimensioned while taking this case into account, in which Voff and $Q_A$ have opposing signs. In this case, the sound must be situated outside the signal bandwidth.

The input offset voltage must be sufficiently high in order to remove the sound from the signal band. It may be subsequently digitally subtracted. The use of a higher offset voltage entails some disadvantages, however: the thermal noise caused by the offset voltage is higher, and if the total input offset (Voff+$Q_A$) is high, the dynamic range available for the input signal decreases, since a portion of the input signal is already occupied by the offset.

Thus, according to an example embodiment of the present invention, it may be advantageous to trim the sign and the amplitude of the offset voltage based on the amplitude and the sign of the quadrature signal. In a rotation rate sensor, the quadrature signal is already extracted via demodulation from the measuring signal. This enables a compensation of the residual quadrature present in the measuring signal, which is caused by a phase shift due to parasites in the circuit. These measured pieces of information may easily be utilized one time at the end of the trial phase or at the start-up in order to digitally trim the offset voltage.

In one further preferred specific embodiment of the rotation rate sensor according to the present invention, it is provided that the read-out circuit includes a calibration module to which the quadrature signal is feedable, and that the calibration module is designed for the purpose of determining the offset voltage while taking the quadrature signal into account. In this way, it is possible to determine the temperature-dependent influence on the quadrature signal multiple times in an "on-chip" manner.

In one further preferred specific embodiment of the rotation rate sensor according to the present invention, it is provided that the useful signal and the offset voltage are addable together at the input of the sigma-delta A/D converter.

In one further preferred specific embodiment of the rotation rate sensor according to the present invention, it is provided that the useful signal is reconstructable by the sigma-delta A/D converter on the basis of the generated bit sequence using reference voltages −Vref, +Vref, and the reconstructed useful signal is subtractable from the analog useful signal at the input of the sigma-delta A/D converter. One of the two reference voltages −Vref, +Vref is acted upon by offset voltage Voff in such a way that the useful signal is reconstructable using reference voltages −Vref, −Vref-Voff for the logic value and reference voltages +Vref+Voff, +Vref for logic value 1 of the bit sequence.

As a result, the single bit quantizer includes asymmetrical references. The injection of the offset voltage using a single bit quantizer including asymmetrical references is easily implementable.

In one further specific embodiment of the rotation rate sensor according to the present invention, it is provided that the sigma-delta A/D converter includes a circuit arrangement for reconstructing the useful signal, including a differential amplifier (A), which includes a negative voltage input VinN, a positive voltage input VinP, a negative voltage output VoutN and a positive voltage output VoutP, a first capacitance C1, via which positive voltage output VoutP is fed back to negative voltage input VinN, a second capacitance C2, via which negative voltage output VoutN is fed back to positive voltage input VinP, a first resistance Rdac1 and first switches s1, s2, via which first voltage V1 is selectively applicable at negative voltage input VinN or at positive voltage input VinP, and a second resistance Rdac2 and second switches s3, s4, via which a second voltage V2 is selectively applicable at negative voltage input VinN or at positive voltage input VinP, first and second switches (s1, s2, s3, s4) being activatable by the bit sequence generated by the sigma-delta A/D converter. The difference between first voltage V1 and second voltage V2 corresponds to reference voltage Vref: V1−V2=Vref. First resistance (Rdac1) and second resistance (Rdac2) are variably adjustable, so that reference voltage Vref is acted upon by offset voltage Voff.

In one further preferred specific embodiment of the rotation rate sensor according to the present invention, it is provided that at least one sub-resistance ΔR1 of first resistance Rdac1 and at least one sub-resistance ΔR2 of second resistance Rdac2 is selectively bridgeable with the aid of a third switch s5, s6, and that third switches s5, s6 are activatable via the bit sequence generated by the sigma-delta A/D converter.

In one further preferred specific embodiment of the rotation rate sensor according to the present invention, it is provided that a subtractor downstream from the sigma-delta A/D converter is provided in order to purge the digitized useful signal of a signal offset corresponding to the offset voltage.

According to a second aspect, the present invention relates to a method for operating a rotation rate sensor. In accordance with an example embodiment of the present invention, the rotation rate sensor includes at least one oscillating mass, which is deflectable in a drive direction and in a detection direction oriented perpendicularly to the drive direction; a drive circuit for prompting a defined oscillatory movement of the oscillating mass in the drive direction; a circuit for detecting a measuring signal, which corresponds to the deflection of the oscillating mass in the detection direction; a read-out circuit for reading out and pre-processing the measuring signal. The read-out circuit includes a demodulator, with which a useful signal and a quadrature signal are extracted from the measuring signal. The read-out circuit includes a sigma-delta A/D converter at least for the useful signal, which generates a bit sequence including the logic values 0 and 1, an offset voltage being fed to the sigma-delta A/D converter, which is selected in such a way that tonal artifacts in the frequency spectrum of the digitized useful signal, which are caused by a low signal amplitude and/or a DC voltage component in the useful signal, are shifted into a frequency range outside of the bandwidths of the useful signal to be expected.

In one preferred specific embodiment of the method according to the present invention, it is provided that the offset voltage and, in particular, the sign of the offset voltage are determined while taking the quadrature signal into account.

In one further preferred specific embodiment of the method according to the present invention, it is provided that the offset voltage is determined in an event-controlled manner, in particular, initiated by an activation of the rotation rate sensor.

In one further preferred specific embodiment of the method according to the present invention, it is provided that the useful signal and offset voltage Voff are added up at the input of the sigma-delta A/D converter.

In one further preferred specific embodiment of the method according to the present invention, it is provided that the sigma-delta A/D converter reconstructs the useful signal on the basis of the generated bit sequence using reference voltages −Vref, +Vref, and subtracts the reconstructed useful signal from the analog useful signal at the input of the sigma-delta A/D converter, one of the two reference voltages −Vref, +Vref being acted upon by offset voltage Voff in such a way that the useful signal is reconstructed using reference voltages −Vref, −Vref-Voff for logic value 0 and reference voltages +Vref+Voff, +Vref for logic value 1 of the bit sequence.

In one further preferred specific embodiment of the method according to the present invention, it is provided that the digitized useful signal is purged of a signal offset corresponding to the offset voltage.

BRIEF DESCRIPTION OF THE DRAWINGS

The present invention is explained in greater detail below with reference to exemplary embodiments schematically indicated in the figures.

DETAILED DESCRIPTION OF EXAMPLE EMBODIMENTS

Figure 1:
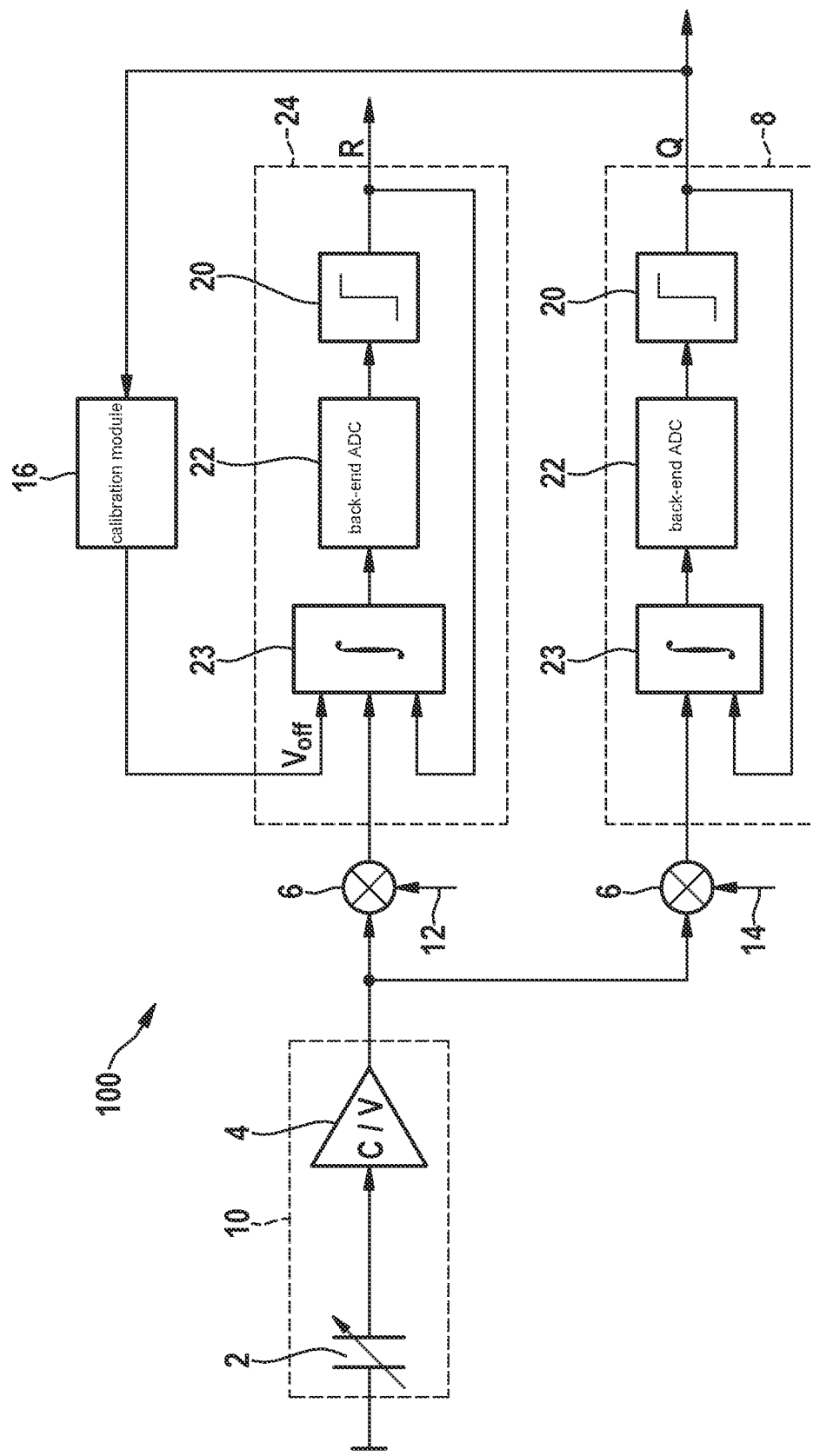
FIG. 1 shows a schematically represented specific embodiment of the rotation rate sensor according to the present invention.

In the figures, identical reference numerals refer to identical or functionally identical elements.

One specific embodiment of the rotation rate sensor according to the present invention, or circuit arrangement 100 of a rotation rate sensor relevant to the invention is schematically represented in FIG. 1.

The rotation rate sensor includes a preferably micromechanical sensor element including an oscillating mass, which is deflectable in a drive direction and in a detection direction oriented perpendicularly to the drive direction. The oscillating mass prompts a defined oscillatory movement in the drive direction, specifically at a resonance frequency f0.

In the case of a rotational movement of the rotation rate sensor about a rotational axis, which is oriented perpendicularly to the drive direction and perpendicularly to the detection direction, the oscillating mass is acted upon by a Coriolis force. This Coriolis force effectuates a deflection of the oscillating mass in the detection direction, which is capacitively detected here. In FIG. 1, a representation of the sensor element including the oscillating mass and the drive circuit has been dispensed with. Only a measuring capacitance 2 is represented, with which the Coriolis force acting upon the oscillating mass in the detection direction is detected. With the aid of a downstream capacitance voltage C/V converter 4, this capacitive signal is converted into a voltage signal, which is referred to below as a measuring signal. In the rotation rate sensor described herein, measuring capacitance 2 and C/V converter 4 form the main components of circuit 10 for detecting the measuring signal.

The measuring signal includes essentially two signal components.

One of the two signal components is generated by the Coriolis force. Its amplitude is proportional to the angle velocity. This useful signal is therefore also referred to as rate R.

The other signal component is caused by manufacturing-related deviations from an ideal sensor geometry and sensor structure such as, for example, from mechanical misalignments between the moved oscillating mass and the electrodes for detecting measuring signals. This signal component is in phase with the position of the oscillating mass and is referred to as quadrature signal Q. It is phase shifted by 90 degrees relative to useful signal R.

The measuring signal may thus be described as follows:

$$R(t) + Q(t) = \Omega(t) * \sin(2\pi f_0 t) + Q_A * \sin\left(2\pi f_0 t + \frac{\pi}{2}\right)$$

$\Omega(t)$ is the angle velocity and $Q_A$ is the amplitude of the quadrature signal.

A read-out circuit for reading out and pre-processing the measuring signal is situated downstream from circuit 10 for detecting the measuring signal. Here, useful signal R and quadrature signal Q are extracted from the measuring signal with the aid of demodulators 6, in order to then initially be analogically/digitally converted in separate signal paths and then to be digitally further processed or evaluated.

Since quadrature signal Q and the drive signal for the oscillating mass of the sensor are in phase, a clock signal 14 obtained from the drive signal is used for the demodulation of quadrature signal Q.

Clock signal 12 used for the demodulation of useful signal R is also obtained from the drive signal, specifically, via phase shifting by 90 degrees. Clock signal 12 is therefore in phase with R(t) and has a frequency f0.

The two signals R(t) and Q(t) frequently experience a phase shift $\phi_d$ with respect to the demodulation clock due to parasitic effects in the circuit: according to the present invention, the demodulation takes place before the analog-digital conversion. If the $$R(t) = Q(t) = \Omega(t) * \sin(2\pi f_0 t + \phi_d) + Q_A * \sin\left(2\pi f_0 t + \frac{\pi}{2} + \phi_d\right)$$

phase shift $\phi_d$ is equal to 0, the demodulation of quadrature signature Q(t) delivers spectral components at multiples of 2*f0, which may be easily filtered out, whereas the demodulation of useful signal R(t) delivers angle velocity $\Omega(t)$ in the base band.

If phase shift $\phi_d$ is not equal to 0, the demodulation of the quadrature signature generates a DC voltage component or DC component in the useful signal. This proves problematical, in particular, for a sigma-delta A/D conversion, since a DC voltage component in this case causes sounds in the signal spectrum of the digitized useful signal, which for sufficiently small values of $Q_A$ are situated in the signal bandwidth of angle velocity $\Omega(t)$, and thus result in a reduction of the quantization noise ratio (SQNR) of the sigma-delta analog-digital converter.

In the specific embodiment shown in FIG. 1, both a sigma-delta A/D converter 8 is provided in the signal path of quadrature signal Q and a sigma-delta A/D converter 24 including an integrator 23, a backend-ADC 22, and a quantizer 20 are provided in the signal path of useful signal R.

According to the present invention, an offset voltage $V_{off}$ is fed to sigma-delta A/D converter 24, which is selected in such a way that tonal artifacts in the frequency spectrum of the digitized useful signal, which are caused by a low signal amplitude and/or a DC voltage component in the useful signal, are shifted into a frequency range outside of the bandwidths of the useful signal to be expected, i.e., of the angle velocity at to be detected.

In principle, offset voltage $V_{off}$ could be determined once, for example, in a trim process by the manufacturer, and then be utilized unchanged and separately from the individually determined quadrature signature for acting upon the sigma-delta A/D converter.

In the exemplary embodiment described herein, however, offset voltage $V_{off}$ is selected as a function of quadrature signal Q. For this purpose, quadrature signal Q is fed to a calibration module 16, which in this case is part of the read-out circuit. On the basis of quadrature signal Q, calibration module 16 determines, in particular, the sign of offset voltage $V_{off}$, but may also determine the magnitude of offset voltage $V_{off}$.

In a first variant of the present invention, offset voltage $V_{off}$ is simply added to useful signal R at the input of sigma-delta A/D converter 24 in order to compensate for a DC voltage component in useful signal R.

In a further, particularly advantageous variant of the present invention, offset voltage $V_{off}$ is injected into sigma-delta A/D converter 24, which is explained in greater detail in connection with FIG. 2.

Figure 2:
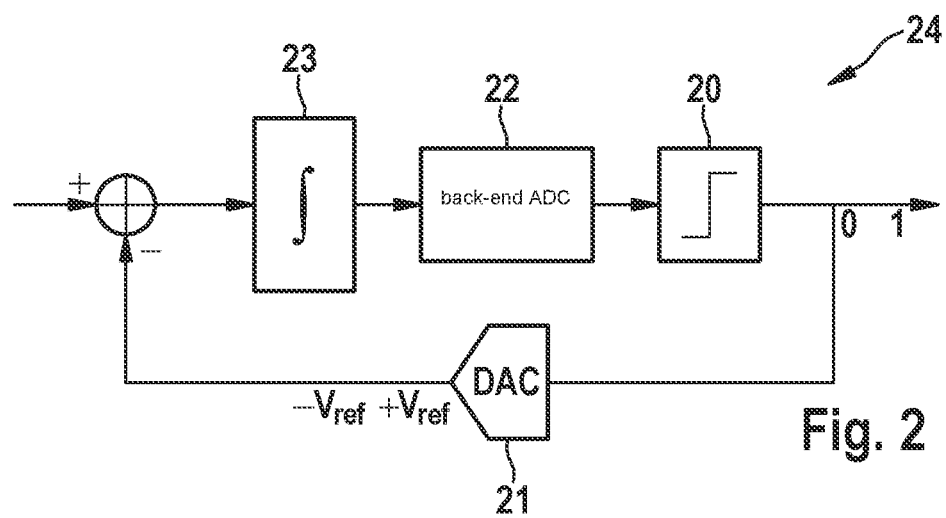
FIG. 2 shows a schematically represented sigma-delta converter of a further specific embodiment of the rotation rate sensor according to the present invention, including a single bit quantizer having asymmetrical references.
Figure 3:
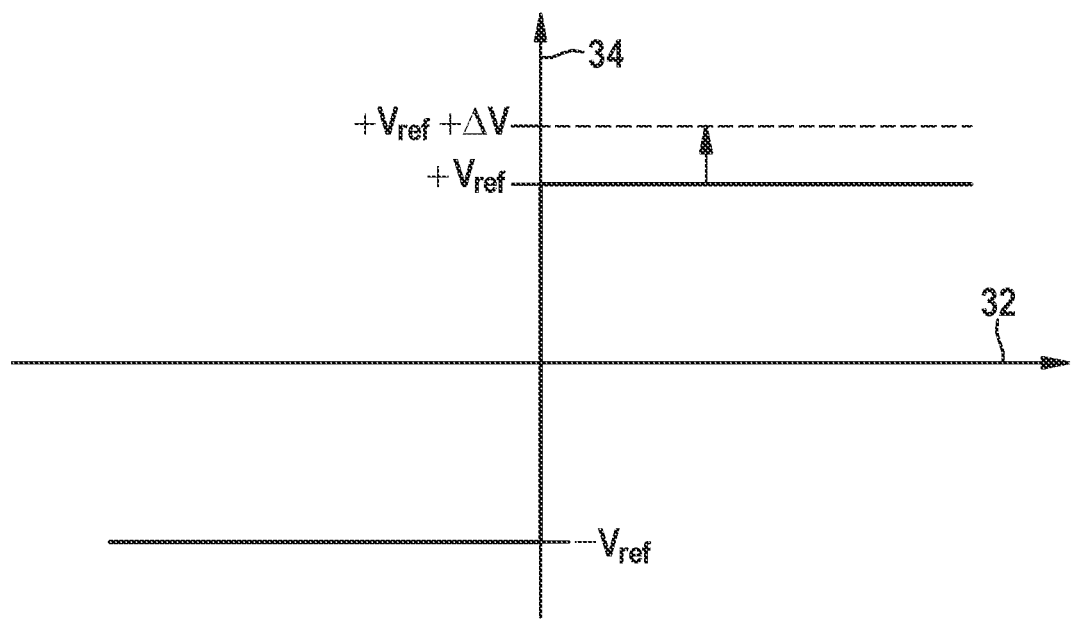
FIG. 3 shows the property of the single bit quantizer of the sigma-delta converter of the specific embodiment of the rotation rate sensor according to the present invention according to FIG. 2.

According to FIG. 2, sigma-delta A/D converter 24 reconstructs the useful signal with the aid of a D/A converter DAC 21, specifically, on the basis of the generated bit sequence and using reference voltages $-V_{ref}$ and $+V_{ref}$ in order to then subtract the reconstructed useful signal from the analog useful signal at the input of the sigma-delta A/D converter. Offset voltage $V_{off}$ is injected here into sigma-delta A/D converter 24 by one of the two reference voltages $-V_{ref}$ or $+V_{ref}$ being acted upon by offset voltage $V_{off}$ in such a way that the useful signal is reconstructable using reference voltages $-V_{ref}$ or $-V_{ref}-V_{off}$ for logic value 0 and reference voltages $+V_{ref}+V_{off}$ or $+V_{ref}$ for logic value 1 of the bit sequence. This is illustrated by FIG. 3. X-axis 32 symbolizes the input of single-bit quantizer 20, whereas y-axis 34 indicates the corresponding value of the reference voltage for D/A converter DAC 21. If the output of quantizer 20 is positive, i.e., 1, the output value is +Vref+ΔV or +Vref+Voff, if the output is 0, the output value is −Vref. Single bit quantizer 20 thus includes asymmetrical references.

This corresponds to a single bit quantizer having an offset +ΔV/2, the full scale of the single bit quantizer being expanded from +/−Vref to +/−Vref+ΔV/2.

The DC voltage component of the useful signal is, virtually 7, compensated for with the aid of the useful signal reconstructed by D/A converter DAC 21. Offset voltage $V_{off}$ is injected here namely by the feedback loop of sigma-delta A/D converter 24 being designed to follow the input signal of sigma-delta A/D converter 24. For this reason, an offset of opposite polarity is generated by using more negative than positive references. This is directly reflected in the generated bit sequence, which will consequently include more zeros than ones.

Figure 4:
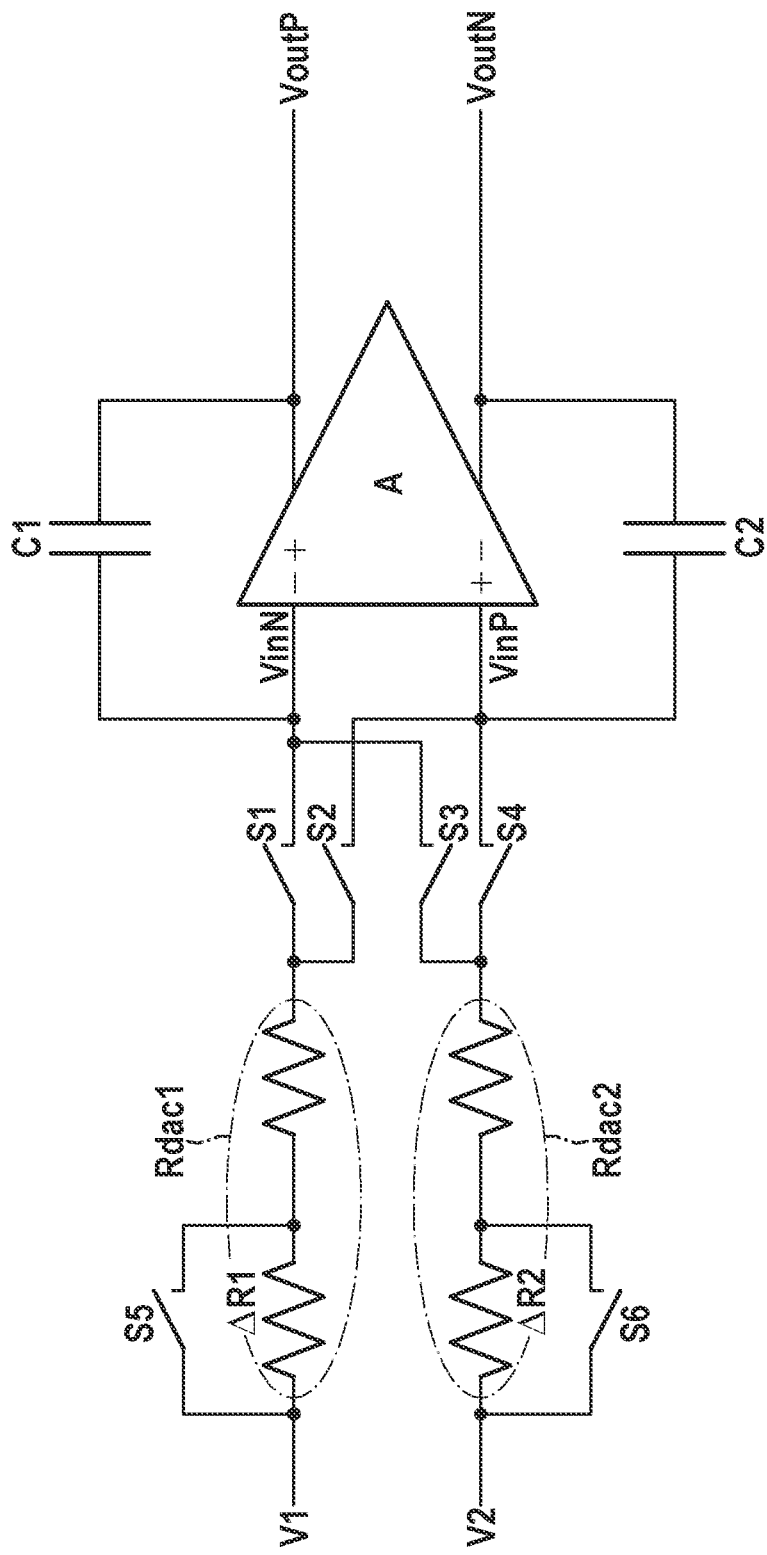
FIG. 4 shows an implementation example of the sigma-delta converter of the specific embodiment of the system according to the present invention according to FIG. 2 for an integrator.

FIG. 4 represents an implementation example of sigma-delta converter 24 shown in FIG. 2 including two different reference voltages for an analog time integrator. The sigma-delta A/D converter includes a circuit arrangement for reconstructing the useful signal, which includes: a differential amplifier A, which includes a negative voltage input VinN, a positive voltage input VinP, a negative voltage output VoutN and a positive voltage output VoutP, a first capacitance C1, via which positive voltage output VoutP is fed back to negative voltage input VinN, a second capacitance C2, via which negative voltage output VoutN is fed back to positive voltage input VinP, a first resistance Rdac1 and first switch s1, s2, via which a first voltage V1 is selectively applicable at negative voltage input VinN or at positive voltage input VinP, and a second resistance Rdac2 and second switches s3, s4, via which a second voltage V2 is selectively applicable at negative voltage input VinN or at positive voltage input VinP. First and second switches s1, s2, s3, s4 are activatable via the bit sequence generated by the sigma-delta A/D converter. The difference between first voltage V1 and second voltage V2 corresponds to reference voltage Vref: V1−V2=Vref. First resistance Rdac1 and second resistance Rdac2 are variably adjustable so that reference voltage Vref is acted upon by offset voltage Voff. A sub-resistance ΔR1 of first resistance Rdac1 and a sub-resistance ΔR2 of second resistance Rdac2 are selectively bridgeable with the aid of a third switch s5, s6, and third switches s5, s6 are activatable via the bit sequence generated by the sigma-delta A/D converter, specifically, by "D" or "NOT(D)". Switches s1, s4 are activatable via the bit sequence generated by the sigma-delta A/D converters, specifically, by "D", whereas switches s2, s3 are activatable by "NOT(D)". Alternatively, switches s1, s4 are activatable by the bit sequence generated by the sigma-delta A/D converter, specifically, by "NOT(D)", whereas switches s2, s3 are activatable by "D".

According to the present invention, the circuit arrangement is easy to implement and has only minimal effects on the overall circuit area.

Figure 5:
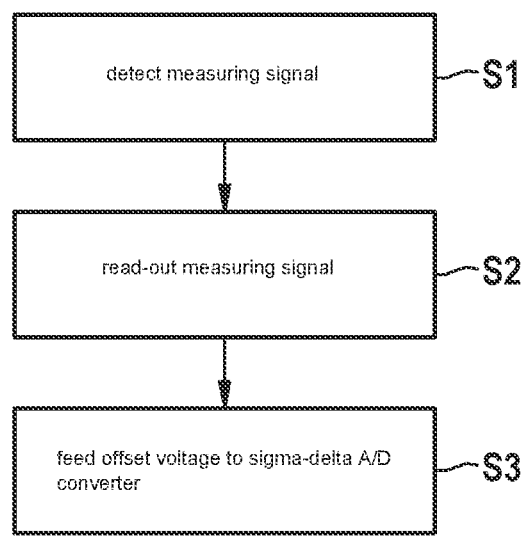
FIG. 5 shows a schematically represented flowchart of one specific embodiment of the method according to the present invention.

The specific embodiment of the method according to the present invention represented in FIG. 5 includes three steps. In step S1, a measuring signal, which corresponds to the deflection of an oscillating mass of the rotation rate sensor in the detection direction, is detected by a circuit of a rotation rate sensor. In step S2, the measuring signal is read out by a read-out circuit of the rotation rate sensor and pre-processed, the read-out circuit including a demodulator, with which a useful signal and a quadrature signal are extractable from the measuring signal, and the read-out circuit including, at least for the useful signal, a sigma-delta A/D converter, via which a bit sequence including logic values 0 and 1 is generatable. In step S3, an offset voltage Voff is fed to the sigma-delta A/D converter, which is selected in such a way that tonal artifacts in the frequency spectrum of the digitized useful signal, which are caused by a low signal amplitude and/or a DC voltage component in the useful signal, are shifted into a frequency range outside of the bandwidths of the useful signal to be expected.

The present invention, although it has been fully described above with reference to preferred exemplary embodiments, is not restricted thereto, but is modifiable in a variety of ways.

What is claimed is:

1. A rotation rate sensor, comprising:
   an oscillating mass which is deflectable in a drive direction and in a detection direction oriented perpendicularly to the drive direction;
   a drive circuit configured to prompt a defined oscillatory movement of the oscillating mass in the drive direction;
   a circuit configured to detect a measuring signal which corresponds to the deflection of the oscillating mass in the detection direction;
   a read-out circuit configured to read out and pre-process the measuring signal, the read-out circuit including at least one demodulator, with which a useful signal and a quadrature signal are extractable from the measuring signal, and the read-out circuit including, at least for the useful signal, a sigma-delta A/D converter, via which a bit sequence including logic values 0 and 1 is generatable thereby digitizing at least the useful signal;
   wherein an offset voltage is feedable to the sigma-delta A/D converter, which is selected in such a way that tonal artifacts in a frequency spectrum of the digitized useful signal, which are caused by a low signal amplitude and/or a DC voltage component in the useful signal, are shifted into a frequency range outside of bandwidths of the useful signal to be expected.

2. The rotation rate sensor as recited in claim 1, wherein a sign of the offset voltage is selected as a function of the quadrature signal.

3. The rotation rate sensor as recited in claim 2, wherein the read-out module includes a calibration module, to which the quadrature signal is feedable, and the calibration module is configured to determine the offset voltage while taking the quadrature signal into account.

4. The rotation rate sensor as recited in claim 1, wherein the useful signal and the offset voltage are added together at an input of the sigma-delta A/D converter.

5. The rotation rate sensor as recited in claim 1, wherein the useful signal is reconstructable via the sigma-delta A/D converter based on the generated bit sequence using reference voltages, and the reconstructed useful signal is subtracted from the analog useful signal at an input of the sigma-delta A/D converter, wherein one of the reference voltages is acted upon by the offset voltage in such a way that the useful signal is reconstructable using the reference voltages for the logic value 0 and the reference voltages for the logic value 1 of the bit sequence.

6. The rotation rate sensor as recited in claim 5, wherein the sigma-delta A/D converter includes a circuit arrangement for reconstructing the useful signal, including:
   differential amplifier, which includes a negative voltage input, a positive voltage input, a negative voltage output and a positive voltage output;
   a first capacitance, via which the positive voltage output is fed back to the negative voltage input;
   a second capacitance, via which the negative voltage output is fed back to the positive voltage input;
   a first resistance and first switches, via which a first voltage is selectively applicable at the negative voltage input or at the positive voltage input; and
   a second resistance and second switches, via which a second voltage is selectively applicable at the negative voltage input or at the positive voltage input;
   wherein the first and second switches are activatable via the bit sequence generated by the sigma-delta A/D converter, a difference between the first voltage and the second voltage corresponds to the reference voltage, and the first resistance and the second resistance are variably adjustable in such a way that the reference voltage is acted upon by the offset voltage.

7. The rotation rate sensor as recited in claim 6, wherein at least one sub-resistance of the first resistance and at least one sub-resistance of the second resistance are selectively bridgeable using a third switch, and the third switches are activatable by the bit sequence generated by the sigma-delta A/D converter.

8. The rotation rate sensor as recited in claim 1, further comprising:
   a subtractor downstream from the sigma-delta A/D converter configured to purge the digitized useful signal of a signal offset corresponding to the offset voltage.

9. A method for operating a rotation rate sensor including an oscillating mass, which is deflectable in a drive direction and in a detection direction oriented perpendicularly to the drive direction, a drive circuit configured to prompt a defined oscillatory movement of the oscillating mass in the drive direction, a circuit configured to detect a measuring signal, which corresponds to the deflection of the oscillating mass in the detection direction, and a read-out circuit configured to read out and pre-process the measuring signal, the read-out circuit including a demodulator, with which a useful signal and a quadrature signal are extracted from the measuring signal, and the read-out circuit including, at least for the useful signal, a sigma-delta A/D converter, which generates a bit sequence including logic values 0 and 1 thereby digitizing at least the useful signal, the method comprising:
   feeding an offset voltage to the sigma-delta A/D converter, which is selected in such a way that tonal artifacts in a frequency spectrum of the digitized useful signal, which are caused by a low signal amplitude and/or a DC voltage component in the useful signal, are shifted into a frequency range outside of bandwidths of the useful signal to be expected.

10. The method as recited in claim 9, wherein a sign of the offset voltage are determined while taking the quadrature signal into account.

11. The method as recited in claim 10, wherein the offset voltage is determined in an event-controlled manner, initiated by an activation of the rotation rate sensor.

12. The method as recited in claim 9, wherein the useful signal and the offset voltage are added together at an input of the sigma-delta A/D converter.

13. The method as recited in claim 9, wherein the sigma-delta A/D converter reconstructs the useful signal based on the generated bit sequence using reference voltages and subtracts the reconstructed useful signal from the analog useful signal at an input of the sigma-delta A/D converter, one of the reference voltages being acted upon by the offset voltage in such a way that the useful signal is reconstructed using the reference voltages for the logic value 0 and reference voltages for the logic value 1 of the bit sequence.

14. The method as recited in claim 9, wherein the digitized useful signal is purged of a signal offset corresponding to the offset voltage.

* * * * *